(12) United States Patent
Bhattacharya et al.

(10) Patent No.: US 7,397,279 B2
(45) Date of Patent: *Jul. 8, 2008

(54) VOLTAGE LEVEL TRANSLATOR CIRCUIT WITH WIDE SUPPLY VOLTAGE RANGE

(75) Inventors: Dipankar Bhattacharya, Macungie, Lehigh County, PA (US); Makeshwar Kothandaraman, Whitehall, Lehigh County, PA (US); John C. Kriz, Palmerton, Carbon County, PA (US); Bernard L. Morris, Emmaus, Lehigh County, PA (US); Joseph E. Simko, Whitehall, Lehigh County, PA (US)

(73) Assignee: Agere Systems Inc., Allentown, PA (US)

( * ) Notice: Subject to any disclaimer, the term of this patent is extended or adjusted under 35 U.S.C. 154(b) by 88 days.

This patent is subject to a terminal disclaimer.

(21) Appl. No.: 11/342,175

(22) Filed: Jan. 27, 2006

(65) Prior Publication Data

US 2007/0176635 A1    Aug. 2, 2007

(51) Int. Cl.
   H03K 19/0175   (2006.01)
   H03K 5/00      (2006.01)
(52) U.S. Cl. .............................. 326/80; 326/63; 326/81; 327/333
(58) Field of Classification Search .................. 326/62, 326/63, 68, 80–83, 86, 87, 93, 95, 98, 66; 327/333, 108, 109
   See application file for complete search history.

(56) References Cited

U.S. PATENT DOCUMENTS

| 5,736,859 | A  | * | 4/1998 | Gore .......................... 324/319 |
| 5,736,869 | A  | * | 4/1998 | Wei .............................. 326/81 |
| 6,064,229 | A  | * | 5/2000 | Morris ......................... 326/81 |
| 6,222,384 | B1 | * | 4/2001 | Kim ............................. 326/68 |
| 6,445,622 | B1 | * | 9/2002 | Hirano .................. 365/189.11 |
| 6,456,110 | B1 | * | 9/2002 | Elamanchili et al. .......... 326/68 |
| 6,614,283 | B1 | * | 9/2003 | Wright et al. ............... 327/333 |
| 6,642,769 | B1 | * | 11/2003 | Chang et al. ................ 327/333 |
| 6,924,689 | B2 | * | 8/2005 | Randazzo et al. ........... 327/333 |
| 6,963,226 | B2 | * | 11/2005 | Chiang ........................ 326/68 |
| 7,068,074 | B2 | * | 6/2006 | Bhattacharya et al. ........ 326/63 |
| 7,176,740 | B2 | * | 2/2007 | Tachibana et al. ........... 327/333 |

* cited by examiner

*Primary Examiner*—Rexford Barnie
*Assistant Examiner*—Dylan White
(74) *Attorney, Agent, or Firm*—Ryan, Mason & Lewis, LLP

(57) ABSTRACT

A voltage level translator circuit for translating an input signal referenced to a first voltage supply to an output signal referenced to a second voltage supply includes an input stage for receiving the input signal, the input stage including at least one transistor device having a first threshold voltage associated therewith. The voltage level translator circuit further includes a latch circuit operative to store a signal representative of a logic state of the input signal, the latch circuit including at least one transistor device having a second threshold voltage associated therewith, the second threshold voltage being greater than the first threshold voltage. A voltage clamp circuit is connected between the input stage and the latch circuit. The voltage clamp circuit is operative to limit a voltage across the input stage, an amplitude of the voltage across the input stage being controlled as a function of a voltage difference between the first and second voltage supplies.

18 Claims, 7 Drawing Sheets

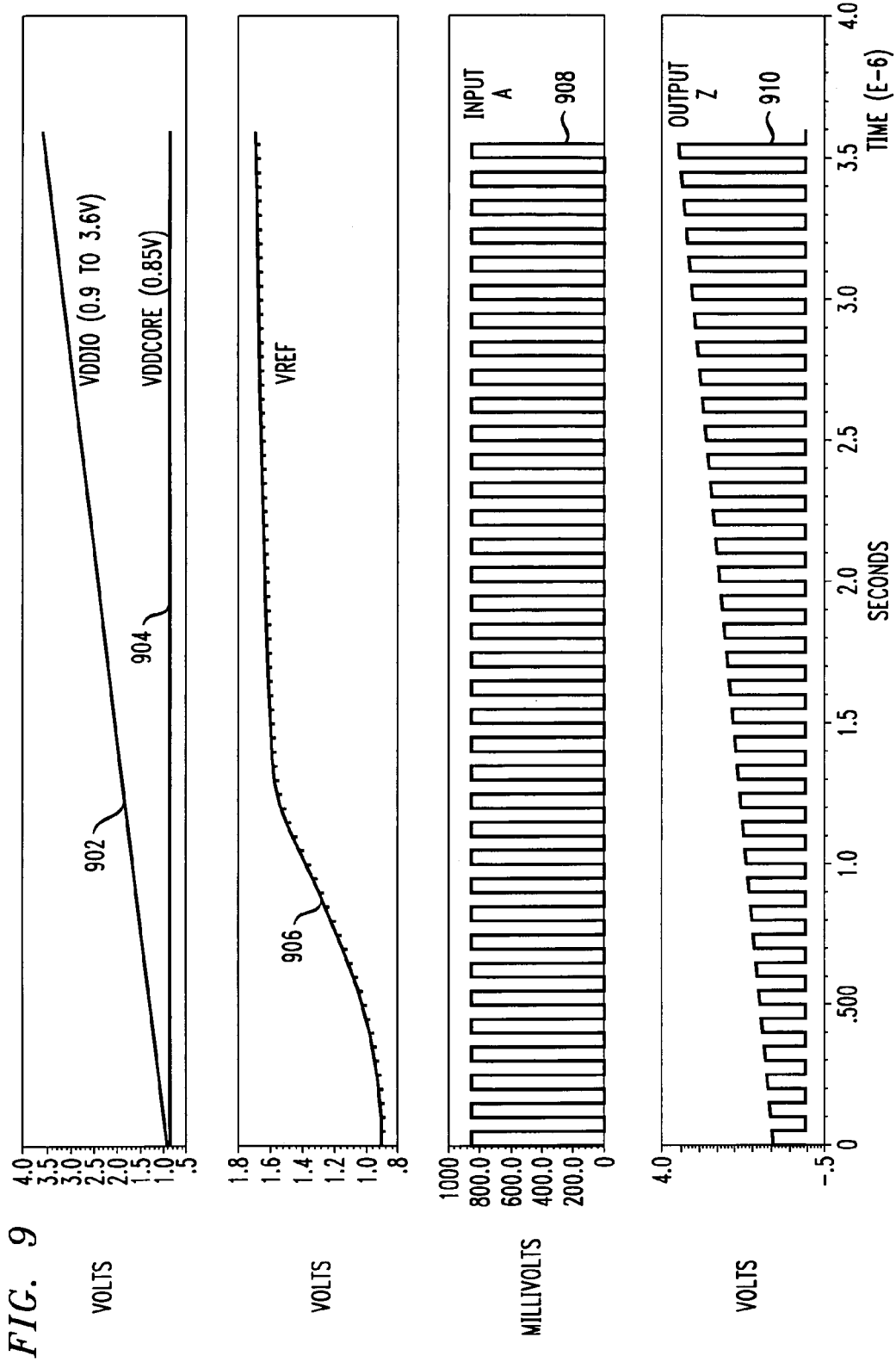

VOLTAGE LEVEL TRANSLATOR CIRCUIT WITH WIDE SUPPLY VOLTAGE RANGE

FIELD OF THE INVENTION

The present invention relates generally to electronic circuits, and more particularly relates to voltage level translator circuits.

BACKGROUND OF THE INVENTION

Certain portable devices, including wireless handsets, notebook computers and personal digital assistants (PDAs), often employ circuitry which runs on two or more different voltage levels. For instance, circuitry utilized with such portable devices may be configured so that a portion of the circuitry, such as, for example, input/output (IO) buffers, runs at a higher voltage level (e.g., about 3.3 volts), as may be supplied by an IO voltage source, while another portion of the circuitry, such as, for example, core logic, runs at a substantially lower voltage level (e.g., about 1.0 volt), as may be supplied by a core voltage source. This difference in voltage levels often necessitates the use of a voltage level translator circuit for interfacing between the multiple voltage levels.

There are many applications in which a circuit (e.g., an IO buffer) may be required to operate over a wide range of IO voltage source levels. The level of the IO voltage source may be determined by the particular application. From a performance standpoint (e.g., speed, power consumption, reliability, etc.), it is generally preferable to manufacture multiple circuits, each circuit being individually optimized for a specific expected IO voltage source level of operation. However, this approach significantly increases the cost of both design and fabrication of the circuits, and is thus undesirable. It is well known that when the IO voltage source is brought down to a level comparable to the core voltage source level, such as, for instance, to conserve power, a standard voltage level translator circuit is often inoperable or operates with poor performance (e.g., slower speed, increased skew, etc.). Thus, standard voltage level translator circuits that are designed to handle a wide range of IO voltage source levels typically do so by compromising on circuit performance.

Accordingly, there exists a need for an improved voltage level translator circuit for interfacing between multiple voltage levels that does not suffer from one or more of the problems exhibited by conventional voltage level translator circuits.

SUMMARY OF THE INVENTION

The present invention meets the above-noted need by providing, in an illustrative embodiment, a voltage translator circuit capable of interfacing between multiple voltage levels, such as, for example, between an input signal, which is referenced to a lower core voltage supply of the circuit, and an output signal, which is referenced to a higher voltage supply of the circuit. Based at least in part on a difference between the higher voltage supply and the lower core voltage supply, the voltage translator circuit is advantageously configured to select one of at least two different reference voltage levels to thereby enable the voltage level translator circuit to operate over a wider supply voltage range compared to standard voltage level translator circuits. Moreover, the voltage level translator circuit of the present invention employs one signal path, and thus the circuit exhibits a substantially constant propagation delay regardless of the level of the higher voltage supply.

In accordance with one embodiment of the invention, a voltage level translator circuit is provided for translating an input signal referenced to a first voltage supply to an output signal referenced to a second voltage supply. The voltage level translator circuit includes an input stage for receiving the input signal, the input stage including at least one transistor device having a first threshold voltage associated therewith. The voltage level translator circuit further includes a latch circuit operative to store a signal representative of a logic state of the input signal, the latch circuit including at least one transistor device having a second threshold voltage associated therewith, the second threshold voltage being greater than the first threshold voltage. A voltage clamp circuit is connected between the input stage and the latch circuit. The voltage clamp circuit is operative to limit a voltage across the input stage, an amplitude of the voltage across the input stage being controlled as a function of a voltage difference between the first and second voltage supplies.

The voltage clamp circuit preferably includes a reference selection circuit operative to receive at least first and second reference signals having first and second amplitudes, respectively, associated therewith, and to select one of the at least first and second reference signals as an output signal of the reference selection circuit based at least in part on the voltage difference between the first and second voltage supplies. The voltage across the input stage is a function of the output signal of the reference selection circuit.

In accordance with another embodiment of the invention, an integrated circuit includes at least one voltage level translator circuit formed in the manner described above.

These and other features and advantages of the present invention will become apparent from the following detailed description of illustrative embodiments thereof, which is to be read in connection with the accompanying drawings.

BRIEF DESCRIPTION OF THE DRAWINGS

FIG. 9 depicts illustrative simulation waveforms for the voltage level translator circuit shown in FIG. 2 employing the exemplary reference circuit of FIG. 7.

DETAILED DESCRIPTION OF THE INVENTION

The present invention will be described herein in the context of illustrative voltage level translator circuits. It should be understood, however, that the present invention is not limited to these or any other particular circuit arrangements. Rather, the invention is more generally applicable to techniques for interfacing between multiple voltage levels in a circuit without suffering any significant degradation in circuit performance over a wide range of supply voltage levels, particularly when a higher voltage supply, to which the output signal of the circuit is referenced, is substantially close in value to a lower core supply, to which an input signal to the circuit is referenced. Although implementations of the present invention are described herein with specific reference to P-channel metal-oxide-semiconductor (PMOS) and N-channel metal-oxide-semiconductor (NMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
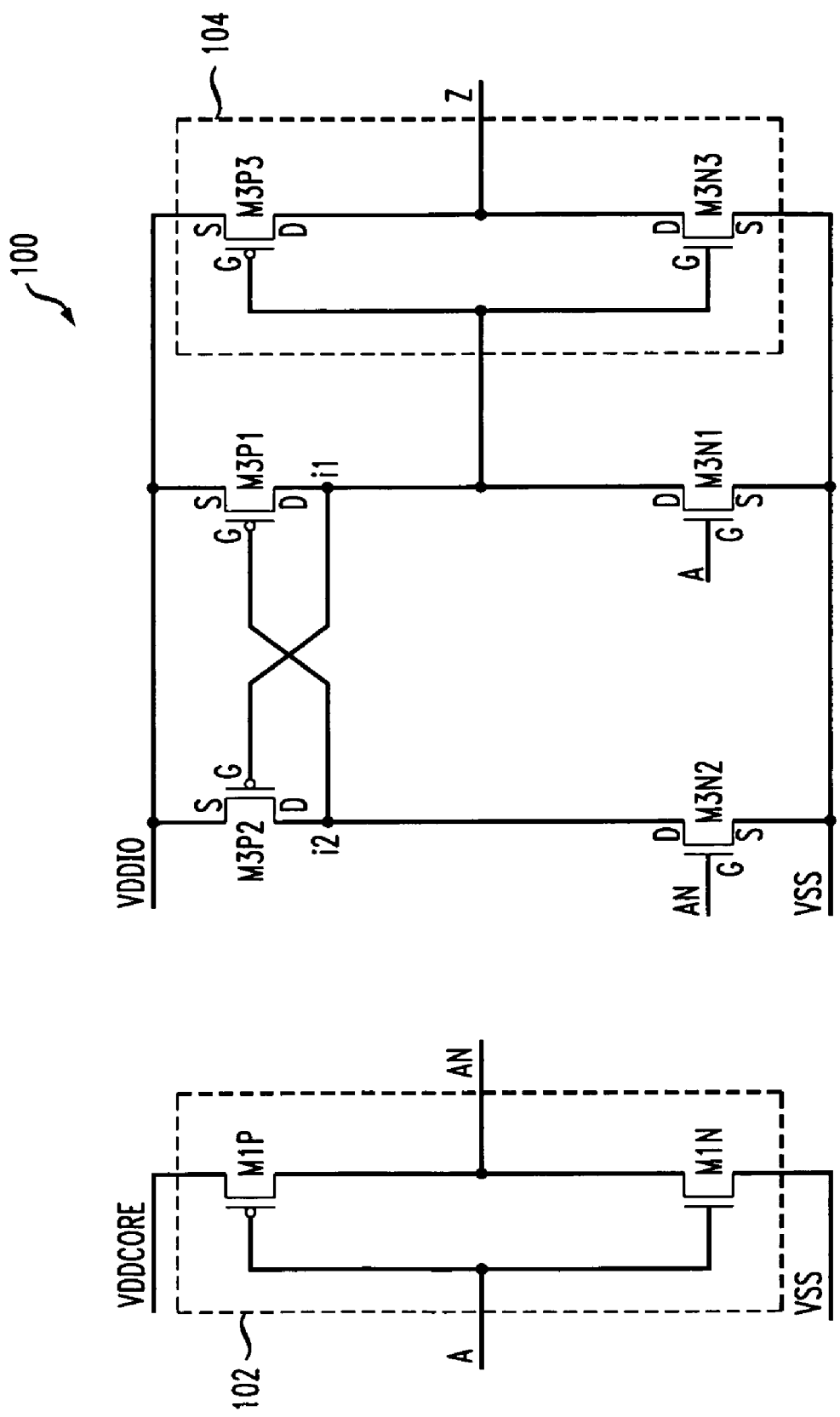
FIG. 1 is a schematic diagram depicting an illustrative voltage level translator circuit which can be modified to incorporate the techniques of the present invention.

FIG. 1 illustrates a voltage level translator circuit 100 which can be used to translate input signals (e.g., signals A and AN) referenced to a lower core supply voltage, such as, for example, VDDCORE, to an output signal Z which is referenced to a higher supply voltage, such as, for example, VDDIO. In many applications, the lower core supply voltage VDDCORE is typically about 1.0 volt and the higher supply voltage VDDIO is typically about 3.3 volts. It is to be appreciated, however, that the present invention is not limited to these or to any other particular voltage levels for VDDCORE and VDDIO. Furthermore, the techniques of the present invention may be similarly employed to translate an input signal referenced to the higher supply voltage VDDIO to an output signal referenced to the lower core supply voltage VDDCORE, as will be understood by those skilled in the art.

Traditional mixed signal integrated circuit processes typically offer both "high voltage" and "low voltage" transistor devices. The high voltage devices generally have a nominal threshold voltage of about 0.75 volts and are intended to operate with the higher supply voltage VDDIO (e.g., about 3.3 volts). The low voltage devices have a nominal threshold voltage which is substantially lower than the high voltage devices, such as, for example, about 0.35 volts, and are intended to operate with the lower core supply voltage VDDCORE (e.g., about 1.0 volt).

Input signal AN is a logical inversion of input signal A, such that when signal A is a logic high level, signal AN is a logic low level, and vice versa. Signals A and AN may be generated, for example, by an inverter 102 including a low voltage PMOS transistor M1P and a low voltage NMOS transistor device M1N connected in a conventional manner. The inverter 102 is powered by the lower core supply VDDCORE and receives, as its negative supply, VSS. The voltage level translator circuit 100 is powered by higher supply voltage VDDIO and receives, as its negative voltage supply, VSS. The term "negative voltage supply" as used herein is intended to refer to a value of the voltage supply relative to VDDIO or VDDCORE, and does not necessarily refer to a voltage less than zero volts, although using a voltage less than zero volts is contemplated by the invention.

The voltage level translator circuit 100 comprises a pair of high voltage PMOS transistor devices M3P1 and M3P2, each device having a source (S) connected to VDDIO, and having a gate (G) of one transistor connected to a drain (D) of the other transistor in a cross-coupled arrangement. Specifically, the gate of M3P1 is connected to the drain of M3P2 at node i2, and the gate of M3P2 is connected to the drain of M3P1 at node i1. Transistors M3P1 and M3P2 are operative to latch a logical state of the voltage level translator circuit 100.

It is to be appreciated that, because a metal-oxide-semiconductor (MOS) device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain.

The voltage level translator circuit 100 further comprises a pair of high voltage NMOS transistor devices M3N1 and M3N2 each having a gate for receiving an input signal A and AN, respectively. Devices M3N1 and M3N2 form an input stage of the voltage level translator circuit 100. Sources of M3N1 and M3N2 are preferably connected to VSS, and drains of M3N1 and M3N2 are connected to the drains of transistors M3P1 and M3P2, respectively. An output stage 104 comprising high voltage PMOS transistor M3P3 and high voltage NMOS transistor M3N3 connected together as a standard inverter, is preferably connected to node i1 and generates an output signal Z of the voltage level translator circuit 100.

The basic operation of the voltage level translator circuit 100 is as follows. When input signal A is a logic high ("1") level, device M3N1 is turned on and pulls node i1 to VSS. Input signal AN, being a logical complement of signal A, is a logic low ("0") level, and therefore device M3N2 will be turned off. Node i1 being at a logic low level turns on device M3P2, thereby pulling node i2 to VDDIO. Node i2 being at a logic high level turns off device M3P1, and thus the half-latch structure comprising devices M3P1 and M3P2 operates in a stable state. Node i1 being low will cause the output Z of the voltage level translator circuit 100 to be a logic high level. Similarly, when the input signal A is a logic low level, device M3N1 is turned off. Input signal AN, being a logical complement of signal A, is a logic high level, and therefore device M3N2 will be turned on, thereby pulling node i2 to VSS. Node i2 being at a logic low level turns on device M3P1, thereby pulling node i1 to VDDIO. Node i1 being at a logic high level turns off device M3P2. Node i1 being high will cause the output Z of the voltage level translator circuit 100 to be a logic low level.

Using current integrated circuit (IC) process technologies, high voltage devices M3N1 and M3N2 may turn on very slowly or not at all when gated by input signals A and AN which are referenced to the core voltage supply VDDCORE. When VDDCORE is about 1.0 volt, for example, the core input signals can be as low as about 0.9 volt, or lower when taking current × resistance (IR) drops within the chip into consideration. Thus, with a threshold voltage of about 0.75 volt, the high voltage devices M3N1 and M3N2 will have less than about 100 millivolts (mV) of overdrive. Even for a marginally high-speed application (e.g., about 100 megahertz (MHz) or so), devices M3N1 and M3N2 will be so slow to turn on that the circuit 100 will most likely fail to perform satisfactorily.

Figure 2:
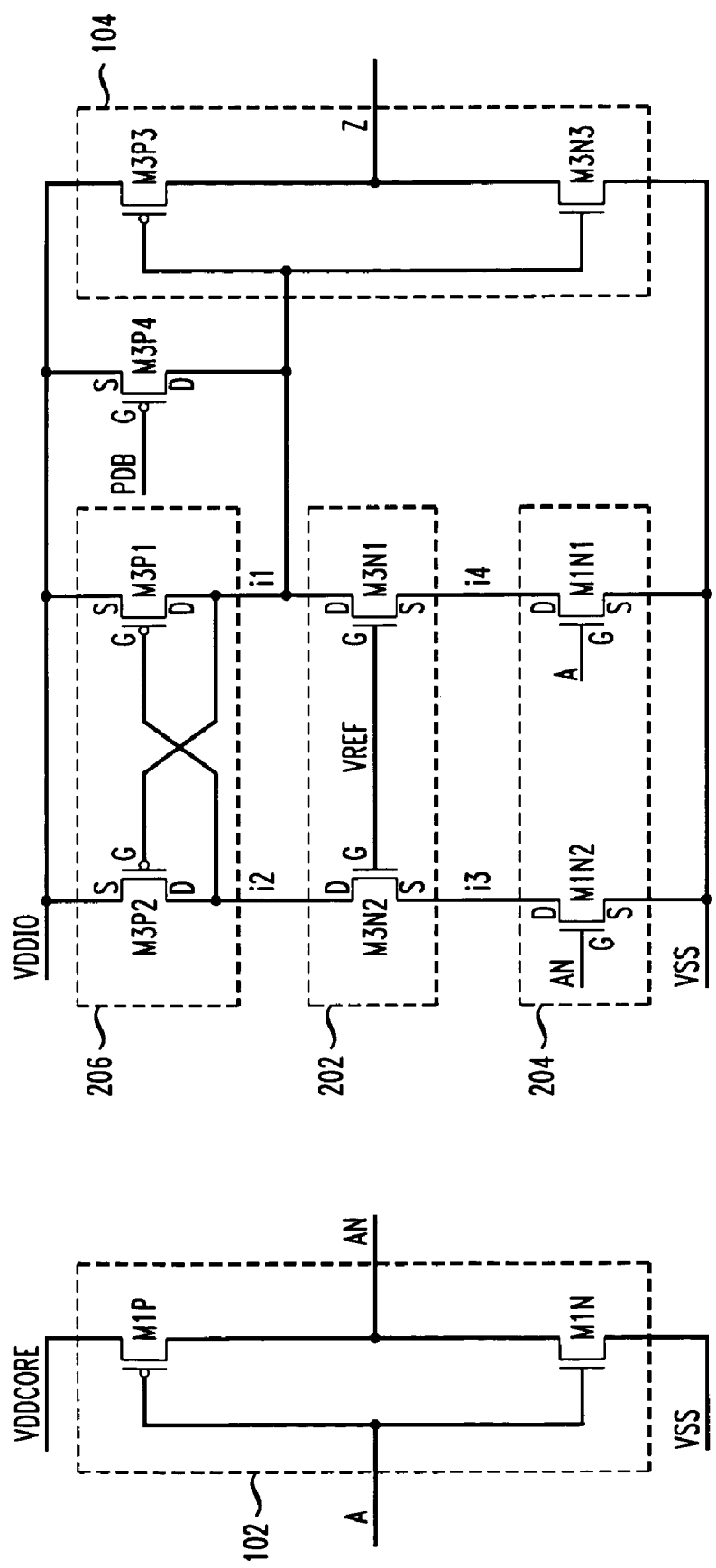
FIG. 2 is a schematic diagram depicting an exemplary voltage level translator circuit in which techniques of the present invention are implemented.

FIG. 2 is a schematic diagram depicting an exemplary voltage level translator circuit 200 which provides a solution to the overdrive problem of the circuit described above in conjunction with FIG. 1. In voltage level translator circuit 200, input signals A and AN drive low voltage devices M1N1 and M1N2, respectively. Devices M1N1 and M1N2 form an input stage 204 of the voltage level translator circuit 200. One benefit to replacing the high voltage devices M3N1 and M3N2 in the voltage level translator circuit 100 shown in FIG. 1 with low voltage devices M1N1 and M1N2, respectively, is that the low voltage devices have a substantially lower threshold voltage associated therewith, typically about 0.35 volt, compared to high voltage devices, which typically have a threshold voltage of about 0.75 volt. Consequently, the low voltage devices M1N1 and M1N2 are able to provide about an additional 400 mV of overdrive compared to high voltage devices of essentially the same size.

In order to protect the low voltage devices M1N1 and M1N2 from receiving the higher supply voltage VDDIO, voltage level translator circuit 200 preferably includes a voltage clamp circuit 202 connected between drains of devices M1N1 and M1N2 and drains of devices M3P1 and M3P2, respectively. The voltage clamp circuit 202 preferably comprises a pair of high-voltage NMOS transistors M3N1 and M3N2. Specifically, the drains of devices M1N1 and M1N2 are connected to sources of devices M3N1 and M3N2 at nodes i4 and i3, respectively. Drains of devices M3N1 and M3N2 are connected to the drains of high voltage PMOS devices M3P1 and M3P2 at nodes i1 and i2, respectively, and gates of M3N1 and M3N2 are connected to a reference source providing a bias voltage, VREF, for clamping the drain voltage at nodes i3 and i4 to a desired voltage level. Since devices M1N1 and M1N2 are low voltage devices, they are generally not able to withstand the higher supply voltage VDDIO, and thus the voltage clamp circuit 202 limits the voltage across the input stage 204 by providing a voltage level at nodes i3 and i4 which protects M1N1 and M1N2 from damage due to over-voltage stress. The voltage across the input stage 204, as the phrase is used herein, is intended to refer to the voltage across bias terminals (e.g., drain and source) of the low voltage NMOS devices M1N1 and M1N2. Preferably, the voltage level at nodes i3 and i4 is never higher than a maximum allowable voltage on the low voltage devices M1N2 and M1N1, respectively.

Devices M3P1 and M3P2 form at least a portion of a latch circuit 206 that is operative to store a signal at an output (e.g., node i1) of the voltage level translator circuit 200 which is representative of a logic state of the input signal (e.g., A or AN) presented to the voltage level translator circuit.

The basic operation of the voltage level translator circuit 200 remains essentially the same as for the voltage level translator circuit 100 described above in conjunction with FIG. 1, except that the input stage of voltage level translator circuit 200 employs low voltage devices (MN1, MN2) for providing faster switching speeds and employs a voltage clamp circuit 202 which protects low voltage devices M1N1 and M1N2 against over-voltage stress primarily for reliability purposes, as previously explained. Node i1 preferably drives a standard inverter output stage 104 for generating the output signal Z, in a manner similar to the voltage level translator circuit 100 shown in FIG. 1.

Figure 3:
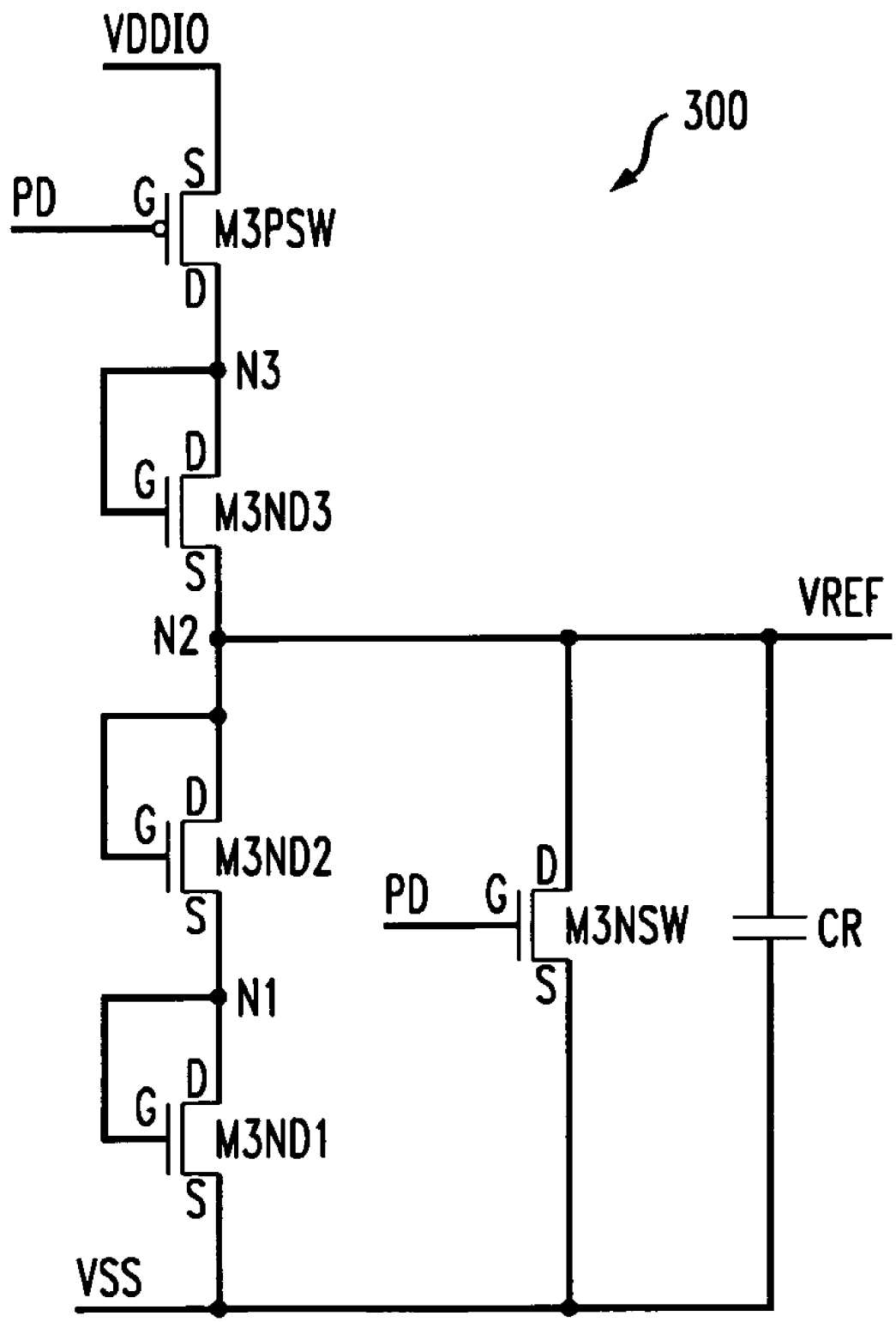
FIG. 3 is a schematic diagram depicting an illustrative reference circuit suitable for use with the voltage level translator circuit shown in FIG. 2.

FIG. 3 illustrates an exemplary reference circuit 300 suitable for use with the voltage level translator circuit 200 shown in FIG. 2. The reference circuit 300 is operative for generating the bias voltage VREF used to clamp the voltage appearing at nodes i3 and i4 of the voltage level translator circuit 200. As apparent from FIG. 3, the exemplary reference circuit 300 may be implemented as simple voltage divider circuit including three diode-connected high voltage NMOS transistor devices, namely, M3ND1, M3ND2 and M3ND3, arranged in a stacked configuration. Specifically, a gate and a drain of M3ND1 are connected to a source of M3ND2 at node Ni, a source of M3ND1 is connected to VSS, a gate and a drain of M3ND2 are connected to a source of M3ND3 at node N2, and a gate and a drain of M3ND3 are connected together at node N3. Node N3 is connected to VDDIO through a resistance implemented as a high voltage PMOS transistor device M3PSW having a drain connected to node N3, and a source connected to VDDIO. The reference circuit 300 may include a capacitor CR coupled between node N2 and VSS which serves, at least in part, to reduce noise which may be introduced in the bias voltage VREF at node N2. Alternatively, capacitor CR may be connected between node N2 and another substantially constant voltage source (e.g., VDDIO), since any substantially constant voltage source functions as an alternating current (ac) ground. The value of capacitor CR is preferably chosen as a function of the desired frequency components to be attenuated, as will be understood by those skilled in the art.

In order to conserve power in the reference circuit 300, a gate of device M3PSW is preferably adapted for receiving a control signal, PD, which may be used to selectively disable the reference circuit, such as during a power-down mode of operation. Transistor M3PSW is preferably a long channel device so as to limit the current in the reference circuit 300 (e.g., about four microamperes). The reference voltage VREF is generated at node N2. Additionally, a high voltage NMOS device, M3NSW, may be included in the reference circuit 300, a source of M3NSW being connected to VSS, a drain of M3NSW being connected to node N2, and a gate of M3NSW being adapted to receive control signal PD. Device M3NSW preferably pulls the reference voltage VREF to VSS (e.g., ground) during the power-down mode of operation.

When control signal PD is a logic high level, device M3PSW will turn off and device M3NSW will turn on, thereby pulling the reference voltage VREF to VSS (e.g., low). With reference again to FIG. 2, VREF being low will turn off voltage clamp devices M3N1 and M3N2, thereby causing node i1 to float. In order to prevent output stage 104 in the voltage level translator circuit 200 from generating an erroneous output signal Z and/or from consuming substantial current (e.g., when the voltage at node i1 is about halfway between VSS and VDDIO), a high voltage PMOS device, M3P4, is preferably included, having a source connected to VDDIO, a drain connected to node i1, and a gate adapted for receiving a second control signal, PDB, which may be a logical complement of control signal PD. When control signal PD is high, control signal PDB will be a logic low level, thereby turning on device M3P4 and pulling node i1 high. Although not explicitly shown, it will become apparent to those skilled in the art that device M3P4 may be replaced by a high voltage NMOS device having a source connected to VSS, a drain connected to node i1, and a gate adapted for receiving control signal PD. Various other mechanisms are similarly contemplated for preventing node i1 from floating when the reference circuit 300 of FIG. 3 is disabled.

For certain semiconductor process technologies (e.g., 130 nanometer process), the core voltage supply VDDCORE can be as low as 0.9 volt. However, the actual core voltage level received at the inputs to the voltage level translator circuit (e.g., 100, 200) may still be lower (e.g., about 0.85 volt) due primarily to IR drops within the chip. The voltage level translator circuit 200 depicted in FIG. 2, in conjunction with reference circuit 300 shown in FIG. 3, works well up to the 0.85 volt core supply. However, if VDDIO is decreased significantly, such as, for example, close to VDDCORE, the reference circuit 300 will most likely fail to provide the required reference signal VREF and the voltage level translator circuit 200 will either operate too slowly or will fail to operate altogether, either of which is undesirable. The voltage level translator circuit 100 depicted in FIG. 1 is capable of operating adequately when VDDIO is decreased substantially (e.g., to about VDDCORE) but does not work properly when the core voltage supply VDDCORE falls below about one volt.

One technique for overcoming the above-noted problem is to detect when the higher voltage supply VDDIO is within a certain prescribed limit of the core voltage supply VDDCORE and to change the signal path within the voltage level translator circuit as a function of a difference between VDDIO and VDDCORE. Specifically, when the difference between VDDIO and VDDCORE is greater than a specified level, the circuit is operative to translate an input signal, which is referenced to the lower core voltage VDDCORE, to an output signal referenced to the higher voltage VDDIO. Alternatively, when the difference between VDDIO and VDDCORE is less than or equal to a specified level, the voltage level translator circuit is advantageously operative to provide a direct signal path from an input of the circuit to an output thereof without translating the input signal, thereby essentially bypassing the voltage level translator circuit. Using this approach, which is described in commonly owned U.S. application Ser. No. 11/065,785, entitled "Self-Bypassing Voltage Level Translator Circuit," the disclosure of which is incorporated by reference herein, the input signal propagates through different signal paths, thus giving rise to different delays, depending on the level of the voltage supply VDDIO relative to the core supply VDDCORE.

In accordance with one aspect of the invention, a voltage level translator circuit is provided which is selectively operable in one of at least two modes as a function of the difference between the higher IO voltage supply VDDIO and the lower core voltage supply VDDCORE. In a first mode, wherein the difference between VDDIO and VDDCORE is greater than a specified level, the voltage level translator circuit is preferably operative to select a first reference signal, VREF1, which may be substantially higher than VDDCORE (e.g., about two threshold voltages above VSS), for biasing a voltage clamp circuit in the voltage level translator circuit. In a second mode, wherein the difference between VDDIO and VDDCORE is less than or equal to the specified level, the voltage level translator circuit is advantageously operative to select a second reference signal, VREF2, which may be substantially equal to the core supply VDDCORE, for biasing the voltage clamp circuit, the second reference signal VREF2 being greater than the first reference signal VREF1. By providing a mechanism for increasing the bias voltage of the voltage clamp circuit in the voltage level translator circuit when VDDIO is comparable to VDDCORE, signal skew is beneficially reduced and speed is increased in the voltage level translator circuit.

Figure 4:
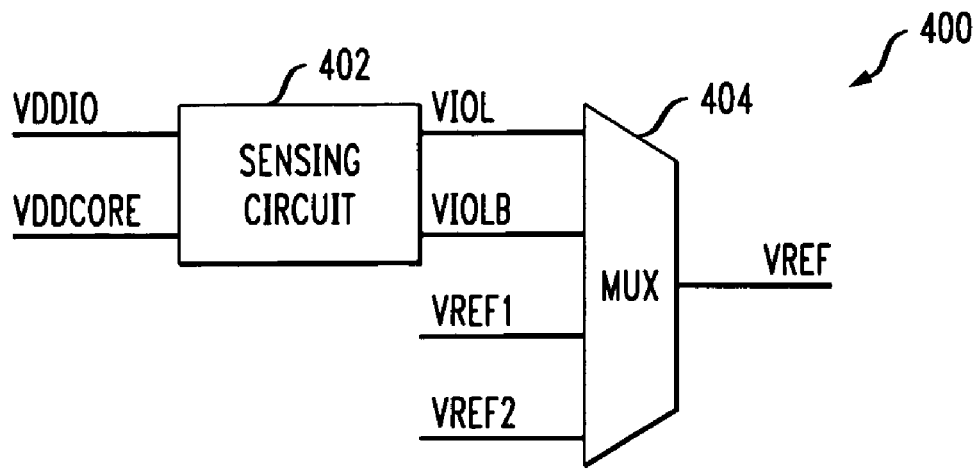
FIG. 4 is a block diagram illustrating an exemplary reference selection circuit, formed in accordance with one embodiment of the present invention.

FIG. 4 is a block diagram depicting an exemplary reference selection circuit 400, formed in accordance with one embodiment of the invention. The exemplary reference selection circuit 400 includes a sensing circuit 402 and a multiplexer 404 operatively coupled to the sensing circuit. The sensing circuit 402 preferably detects a voltage difference between VDDIO and VDDCORE and generates at least one control signal which is representative of whether or not VDDIO is within a prescribed threshold voltage of VDDCORE. Specifically, sensing circuit 402 is operative to compare VDDIO with VDDCORE and to generate control signals, VIOL and VIOLB, as a function of the difference between VDDIO and VDDCORE. For example, when VDDIO is greater than a threshold voltage above VDDCORE, control signal VIOL is a logic low level and control signal VIOLB, being a logical complement of VIOL, is a logic high level. When VDDIO falls to less than or equal to a threshold voltage of VDDCORE, control signal VIOL will go high and control signal VIOLB will go low.

The control signals VIOL and VIOLB generated by the sensing circuit 402 are used by multiplexer 404 to select one of two reference signals, VREF1 and VREF2, supplied to the reference selection circuit 400. The present invention also contemplates that reference signals VREF1 and VREF2 may be generated within the reference selection circuit 400, such as, for example, by a bandgap reference (not explicitly shown) or alternative reference generator included in the reference selection circuit. An output signal, VREF, generated by multiplexer 404 will be substantially equal to VREF1 or VREF2, depending on the logical states of control signals VIOL and VIOLB. Output signal VREF is preferably used to bias voltage clamp 202 in the voltage level translator circuit 200 of FIG. 2. Although multiplexer 404 is shown as being adapted to receive only two reference signals VREF1 and VREF2 as inputs thereto, the invention is not limited to any particular number of reference signals. Rather, multiplexer 404 may be operative to connect the output signal VREF to any number of reference signals supplied to the multiplexer. To accomplish this, the sensing circuit 402 may be adapted accordingly to detect when the difference between VDDIO and VDDCORE is within multiple prescribed voltage ranges, and to generate a plurality of control signals, each control signal being indicative of the difference between VDDIO and VDDCORE being within less than or equal to a corresponding voltage level and/or range.

In one embodiment of the invention, reference signal VREF1 may be set equal to the reference voltage VREF generated as an output of the reference circuit 300 depicted in FIG. 3. In this instance, as long as the IO voltage supply VDDIO is high enough to appropriately bias NMOS devices M3ND1, M3ND2 and M3ND3 in the reference circuit 300 (FIG. 3) and assuming the reference circuit is powered on (e.g., control signal PD is low), reference signal VREF1 will be substantially equal to about two NMOS threshold voltages above VSS (e.g., about 1.5 volts). As VDDIO falls to less than about three threshold voltages above VSS (e.g., less than about 2.25 volts), NMOS device M3ND1, M3ND2, M3ND3 will begin to turn off, and thus the reference circuit 300 will no longer be able to maintain VREF at about two threshold voltages above VSS. Reference signal VREF2 may be set equal to the core supply voltage VDDCORE. Thus, when VDDIO is greater than one threshold voltage above VDDCORE, reference signal VREF1 is preferably selected as the output signal VREF generated by reference selection circuit 400, and reference signal VREF2 is selected otherwise. Since VDDCORE is selected as the output signal VREF for biasing the voltage clamp when the higher voltage supply VDDIO is substantially equal to the lower core voltage supply VDDCORE, the voltage level translator circuit 200 (see FIG. 2) will continue to work properly even for low IO supply voltages.

Figure 5:
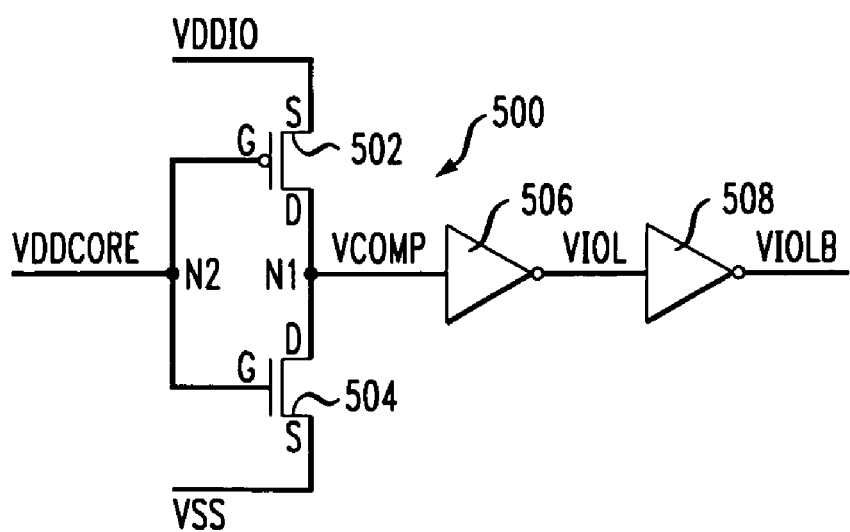
FIG. 5 is a schematic diagram illustrating an exemplary sensing circuit suitable for use with the reference selection circuit shown in FIG. 4, in accordance with one embodiment of the present invention.

FIG. 5 is a schematic diagram depicting an exemplary sensing circuit 500 which may be employed to implement the sensing circuit 402 shown in FIG. 4, in accordance with one aspect of the invention. It is to be understood that the invention is not limited to the particular sensing circuit arrangement shown. Sensing circuit 500 preferably includes a PMOS device 502 and an NMOS device 504 configured as a first inverter. Specifically, a source of device 502 is adapted for connection to the IO supply VDDIO, a drain of device 502 is connected to a drain of device 504 at node N1, gates of devices 502 and 504 are connected together at node N2, and a source of device 504 is adapted for connection to VSS. The first inverter is driven by the core voltage supply VDDCORE at node N2. The sensing circuit 500 further includes a second inverter 506 and a third inverter 508 for generating the control signals VIOL and VIOLB, respectively. An input of inverter 506 is preferably connected to an output of the first inverter at node N1 and an output of inverter 506 is connected to an input of inverter 508. Control signal VIOL is generated at the output of second inverter 506 and control signal VIOLB, which is a logical complement of signal VIOL, is generated at an output of third inverter 508. Inverters 506 and 508 serve at least in part to buffer an output signal, VCOMP, generated by the first inverter.

Devices 502 and 504 are preferably sized, such as, for example, by appropriate selection of a channel width-to-length (W/L) ratio of one or both devices, so as to form a relatively weak inverter having a high switching point (e.g., closer to VDDIO than to VDDIO/2) compared to that of a standard inverter. PMOS device 502 remains turned on as long as the IO voltage supply VDDIO is at least one threshold voltage higher than the core voltage supply VDDCORE. In this instance, the output VCOMP of the first inverter at node N1 will be high, and thereby control signal VIOL will be low and control signal VIOLB will be high. When VDDIO becomes less than about a threshold voltage above VDDCORE, PMOS device 502 begins to turn off and NMOS device 504 pulls node Ni to VSS (e.g., low). In this instance, VCOMP will be low, control signal VIOL will be high and control signal VIOLB will be low.

Figure 6:
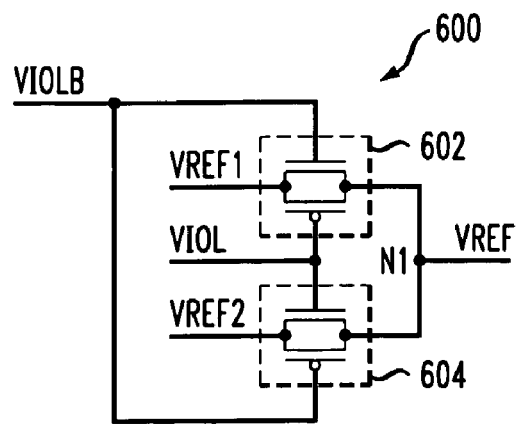
FIG. 6 is a schematic diagram illustrating an exemplary multiplexer circuit suitable for use with the reference selection circuit shown in FIG. 4, in accordance with one embodiment of the present invention.

FIG. 6 is a schematic diagram depicting an exemplary multiplexer 600 which may be employed to implement the multiplexer 404 shown in FIG. 4, in accordance with one aspect of the invention. It is to be understood that the invention is not limited to the particular multiplexer arrangement shown. Multiplexer 600 preferably comprises first and second transmission gates (also referred to as pass gates), 602 and 604, respectively, or alternative switching circuitry. Each of the transmission gates 602, 604 includes an NMOS device and a PMOS device connected together in a parallel arrangement as shown. The transmission gates function as bidirectional switches that are controlled by control signals VIOL and VIOLB. An input of the first transmission gate 602 is preferably adapted to receive first reference signal VREF1 and an input of the second transmission gate 604 is adapted to receive second reference signal VREF2. An output of transmission gate 602 is connected to an output of transmission gate 604 at node N1 for generating output signal VREF of the multiplexer 600.

Control signal VIOL is applied to the gate of the PMOS device in transmission gate 602 and to the gate of the NMOS device in transmission gate 604, and control signal VIOLB, which is a logical complement of signal VIOL, is applied to the gate of the NMOS device in transmission gate 602 and to the gate of the PMOS device in transmission gate 604. With the multiplexer configured in this manner, when control signal VIOL is low, reference signal VREF1 is selected as the output signal VREF of the multiplexer 600, and reference signal VREF2 is selected otherwise.

Figure 7:
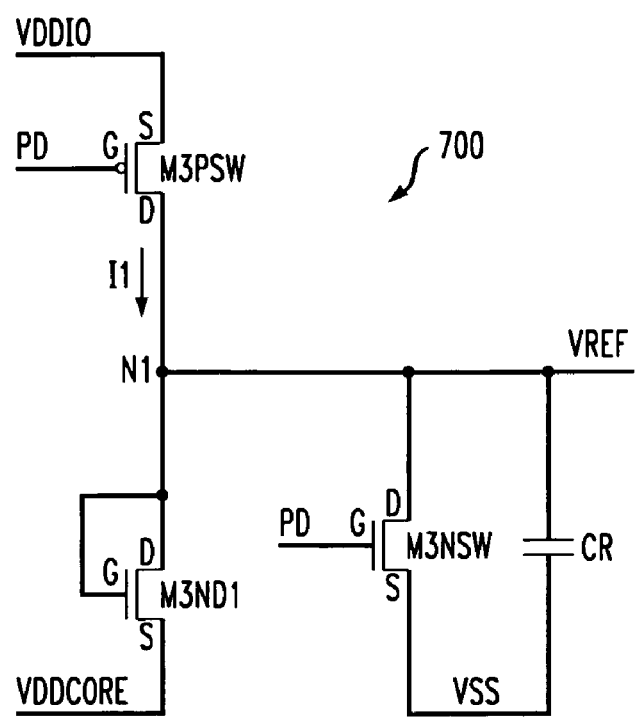
FIG. 7 is a schematic diagram depicting an exemplary reference circuit suitable for use with the voltage level translator circuit shown in FIG. 2, formed in accordance with an illustrative embodiment of the present invention.

FIG. 7 is a schematic diagram depicting an exemplary reference selection circuit 700, formed in accordance with one embodiment of the present invention. Reference selection circuit 700 may be used in an illustrative implementation of the reference selection circuit 400 (see FIG. 4) for biasing the voltage clamp circuit 202 in the voltage level translator circuit 200 of FIG. 2. It is to be appreciated that the invention is not limited to the particular reference selection circuit arrangement shown.

Reference selection circuit 700 preferably includes a first high voltage NMOS device M3ND1, connected in a diode configuration, and a high voltage PMOS device M3PSW which serves essentially as a gated switch. Specifically, a source of device M3ND1 is adapted for connection to core voltage supply VDDCORE and a gate and drain of M3ND1 are connected to a drain of device M3PSW at node N1. A source of device M3PSW is adapted for connection to IO voltage supply VDDIO, and a gate of M3PSW is adapted to receive a control signal, PD, which may be a power-down signal, for selectively disabling the reference selection circuit 700. When selective disabling of the reference selection circuit is not required, device M3PSW may be replaced by a resistor, or an alternative load element, of a suitable value. An output signal, VREF, for biasing the voltage clamp circuit 202 in the voltage level translator circuit 200 of FIG. 2 is generated at node N1.

PMOS device M3PSW is preferably a long channel device so as to limit the current, I1, in the reference selection circuit 700 when control signal PD is inactive (e.g., logic low). When VDDIO is substantially higher than VDDCORE (e.g., greater than one threshold voltage), the output signal VREF generated at node N1 will be about one threshold voltage above VDDCORE (e.g., about 1.75 volts). This voltage is essentially substantially equal to a maximum acceptable voltage level that can be applied to the gates of the NMOS devices (M3N1 and M3N2) in the voltage clamp circuit 202 in the voltage level translator circuit 200 (see FIG. 2) without overstressing the low voltage NMOS devices (M1N1 and M1N2) in the input stage 204 of the voltage level translator circuit. This is because nodes i3 and i4 can see a maximum value of about one threshold voltage below VREF, which is substantially equal to VDDCORE.

When VDDIO falls to within about one threshold voltage or less above VDDCORE, the diode-connected NMOS device M3ND1 will turn off but device M3PSW, which is gated by the control signal PD, will remain turned on, thereby pulling node N1, and thus output signal VREF, up to substantially VDDIO. In this instance, VREF can be about one threshold voltage or lower above VDDCORE. Device M3PSW is preferably sized to be weak, such as, for example, by selecting a long channel W/L ratio of substantially less than one, in order to limit current I1 in the reference selection circuit 700 and to ensure that output signal VREF is never higher than about one threshold voltage above VDDCORE.

During a power-down mode of operation, control signal PD is preferably a logic high level, thereby turning off PMOS device M3PSW. When this occurs, the voltage VREF generated at node N1 will be undetermined and may undesirably float. In order to prevent VREF from becoming undefined, a second high voltage NMOS device, M3NSW, is preferably included in the reference selection circuit, connected between node N1 and VSS and gated by the control signal PD. Thus, when signal PD is high, such as during the power-down mode, device M3NSW will be turned on, thereby pulling node N1 to VSS. Alternatively, device M3NSW may be connected between node N1 and another voltage source, such as, for example, VDDCORE. The reference selection circuit 700 may also include a capacitor, CR, connected between node N1 and VSS. Capacitor CR serves, at least in part, to reduce noise which may be introduced in the voltage VREF at node N1. Alternatively, capacitor CR may be connected between node N1 and another substantially constant voltage source (e.g., VDDCORE), since any substantially constant voltage source functions as an ac ground. The value of capacitor CR is preferably chosen as a function of the desired frequency components to be attenuated, as will be understood by those skilled in the art.

Figure 8:
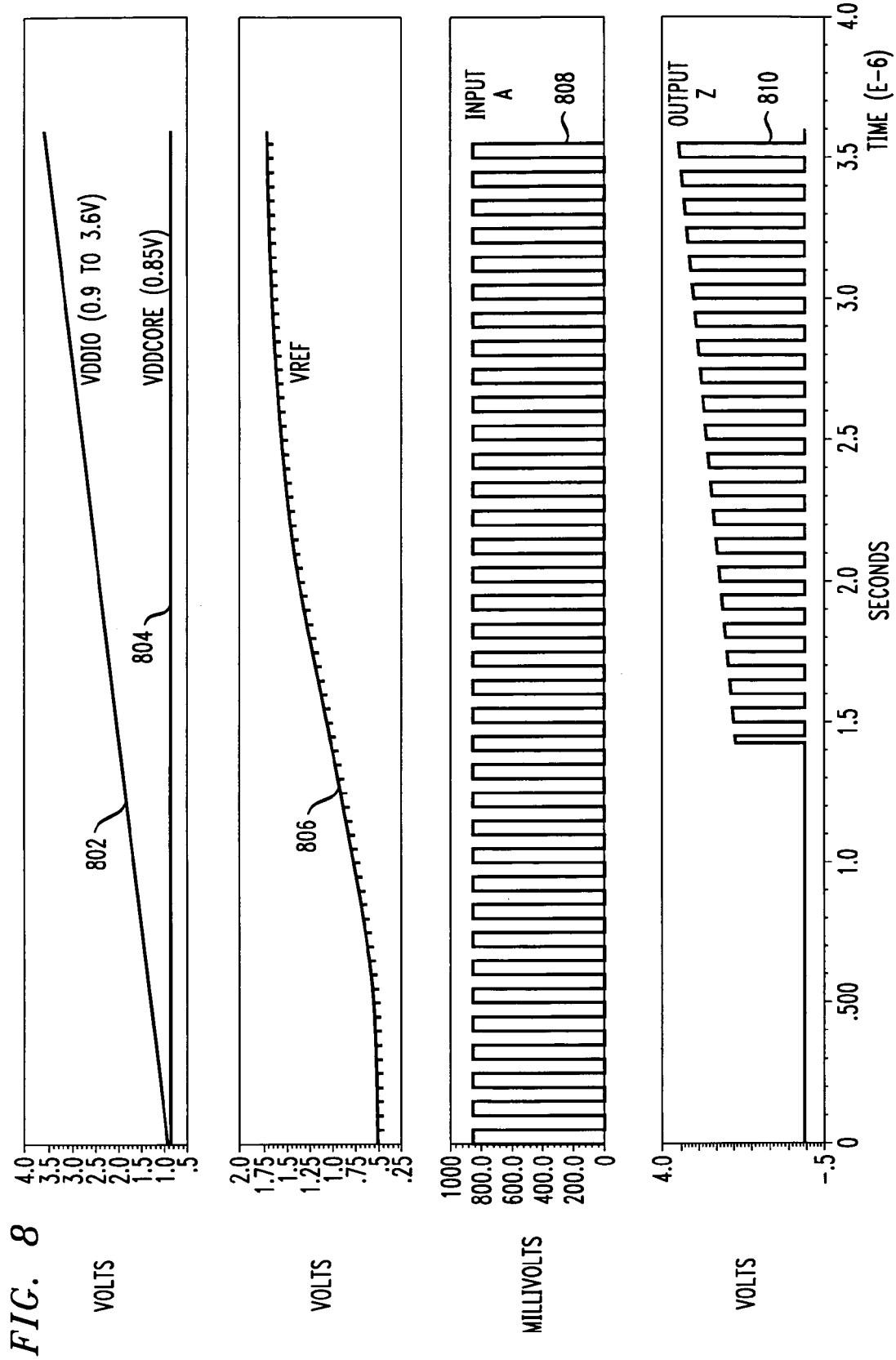
FIG. 8 depicts illustrative simulation waveforms for the voltage level translator circuit shown in FIG. 2 employing the exemplary reference circuit of FIG. 3.

FIG. 8 is a graphical representation of exemplary simulation results of certain signals in the illustrative voltage level translator circuit 200 of FIG. 2 when used in conjunction with the reference circuit 300 shown in FIG. 3, as a function of time (in seconds). The simulation results are provided for the illustrative voltage level translator circuit operating at a speed of about 10 megahertz (MHz) and under worst case process, voltage and temperature (PVT) conditions (e.g., slow integrated circuit process and low temperature). The higher IO voltage supply VDDIO is represented by graph 802, the lower core voltage supply VDDCORE is represented by graph 804, the voltage VREF generated by reference circuit 300 (FIG. 3) for biasing the voltage clamp circuit (202 in FIG. 2) is represented by graph 806, input signal A supplied to the voltage level translator circuit (200 in FIG. 2) is represented by graph 808, and the output signal Z generated by the voltage level translator circuit is represented by graph 810. VDDIO is varied from 0.9 volt to about 3.6 volts while VDDCORE is held at 0.85 volt. As apparent from the figure, when VDDIO is less than about 1.9 volts, the output signal Z generated by the voltage level translator circuit is zero, indicating that the circuit fails to function properly over the intended supply voltage range.

FIG. 9, on the other hand, is a graphical representation of exemplary simulation results of certain signals in the illustrative voltage level translator circuit 200 of FIG. 2 when used in conjunction with the reference circuit 700 shown in FIG. 7, as a function of time (in seconds). The simulation results are provided for the illustrative voltage level translator circuit operating under the same conditions as in FIG. 8, namely, at a speed of about 10 MHz and under worst case PVT conditions (e.g., slow integrated circuit process and low temperature). The IO voltage supply VDDIO is represented by graph 902, the lower core voltage supply VDDCORE is represented by graph 904, the voltage VREF generated by the reference selection circuit 700 (FIG. 7) for biasing the voltage clamp circuit (202 in FIG. 2) is represented by graph 906, input signal A supplied to the voltage level translator circuit (200 in FIG. 2) is represented by graph 908, and the output signal Z generated by the voltage level translator circuit is represented by graph 910.

As in the simulation depicted in FIG. 8, VDDCORE is held at 0.85 volt and VDDIO is varied from 0.9 volt to 3.6 volts. When VDDIO is very low, the value of VREF is substantially equal to VDDIO. As VDDIO increases, VREF increases in a substantially continuous fashion, reaching a steady-state value of about one threshold above VDDCORE. As apparent from the figure, the voltage level translator circuit generates an acceptable output signal Z over the entire variation of VDDIO (e.g., from about 0.9 volt to about 3.6 volts), indicating that the circuit functions properly over a substantially wider supply voltage range compared to the voltage level translator circuit when used in conjunction with the reference circuit 300 of FIG. 3.

It is to be appreciated that the voltage level translation techniques of the present invention described herein may be used with alternative circuit configurations for translating among other voltage levels, as will be apparent to those skilled in the art. For example, a translator circuit (not shown) may be employed comprising transistor devices having polarities opposite to the polarities of the transistor devices in voltage level translator circuit 200 depicted in FIG. 2, as will be understood by those skilled in the art.

At least a portion of the voltage level translator circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A voltage level translator circuit for translating an input signal referenced to a first voltage supply to an output signal referenced to a second voltage supply, the circuit comprising:
   an input stage for receiving the input signal, the input stage including at least one transistor device having a first threshold voltage associated therewith;
   a latch circuit coupled to the input stage and operative to store a signal representative of a logic state of the input signal, the latch circuit including at least one transistor device having a second threshold voltage associated therewith, the second threshold voltage being greater than the first threshold voltage; and
   a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies;
   wherein the voltage clamp circuit comprises a reference selection circuit operative to receive at least first and second reference signals having first and second amplitudes, respectively, associated therewith, and to select one of the at least first and second reference signals as an output signal of the reference selection circuit based at least in part on the voltage difference between the first and second voltage supplies, the voltage across the input stage being a function of the output signal of the reference selection circuit.

2. The voltage level translator circuit of claim 1, wherein the voltage clamp circuit comprises a sensing circuit operative to receive at least the first and second voltage supplies and to generate at least a first control signal indicative of the voltage difference between the first and second voltage supplies, the voltage across the input stage being controlled as a function of the first control signal.

3. A voltage level translator circuit for translating an input signal referenced to a first voltage supply to an output signal referenced to a second voltage supply, the circuit comprising:
   an input stage for receiving the input signal, the input stage including at least one transistor device having a first threshold voltage associated therewith;
   a latch circuit coupled to the input stage and operative to store a signal representative of a logic state of the input signal, the latch circuit including at least one transistor device having a second threshold voltage associated therewith, the second threshold voltage being greater than the first threshold voltage; and a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies, the voltage clamp circuit comprising a sensing circuit operative to receive at least the first and second voltage supplies and to generate at least a first control signal indicative of the voltage difference between the first and second voltage supplies, the voltage across the input stage being controlled as a function of the first control signal;

wherein the first control signal is indicative of at least one of: (i) whether or not the voltage difference between the first and second voltage supplies is less than or about equal to a specified amount; and (ii) whether or not the voltage difference between the first and second voltage supplies is greater than the specified amount.

4. A voltage level translator circuit for translating an input signal referenced to a first voltage supply to an output signal referenced to a second voltage supply, the circuit comprising:

an input stage for receiving the input signal, the input stage including at least one transistor device having a first threshold voltage associated therewith;

a latch circuit coupled to the input stage and operative to store a signal representative of a logic state of the input signal, the latch circuit including at least one transistor device having a second threshold voltage associated therewith, the second threshold voltage being greater than the first threshold voltage; and a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies, the voltage clamp circuit comprising a sensing circuit operative to receive at least the first and second voltage supplies and to generate at least a first control signal indicative of the voltage difference between the first and second voltage supplies, the voltage across the input stage being controlled as a function of the first control signal;

wherein the sensing circuit comprises:

a first inverter comprising a PMOS device and an NMOS device, a source of the PMOS device being adapted for connection to the second voltage supply, a drain of the PMOS device being connected to a drain of the NMOS device at a first node, a gate of the PMOS device being adapted for connection to the first voltage supply, a source of the NMOS device being adapted for connection to a third voltage supply, and a gate of the NMOS device being adapted for connection to the first voltage supply; and at least a second inverter including an input connected to the first node and an output for generating the first control signal.

5. The voltage level translator circuit of claim 4, wherein the PMOS and NMOS devices are sized relative to one another such that a switching point of the first inverter is closer to the second voltage supply than to a midpoint between the second and third voltage supplies.

6. A voltage level translator circuit for translating an input signal referenced to a first voltage supply to an output signal referenced to a second voltage supply, the circuit comprising:

an input stage for receiving the input signal, the input stage including at least one transistor device having a first threshold voltage associated therewith;

a latch circuit coupled to the input stage and operative to store a signal representative of a logic state of the input signal, the latch circuit including at least one transistor device having a second threshold voltage associated therewith, the second threshold voltage being greater than the first threshold voltage; and a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies;

wherein the voltage clamp circuit comprises a sensing circuit operative to receive at least first and second signals, each of the first and second signals being indicative of an amplitude of the first and second voltage supplies, respectively, the sensing circuit being further operative to generate at least a first control signal indicative of the voltage difference between the first and second voltage supplies, the voltage across the input stage being controlled as a function of the first control signal.

7. A voltage level translator circuit for translating an input signal referenced to a first voltage supply to an output signal referenced to a second voltage supply, the circuit comprising:

an input stage for receiving the input signal, the input stage including at least one transistor device having a first threshold voltage associated therewith;

a latch circuit coupled to the input stage and operative to store a signal representative of a logic state of the input signal, the latch circuit including at least one transistor device having a second threshold voltage associated therewith, the second threshold voltage being greater than the first threshold voltage; and a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies;

wherein the voltage clamp circuit comprises:

a sensing circuit operative to receive at least the first and second voltage supplies and to generate at least a first control signal representative of the voltage difference between the first and second voltage supplies; and switching circuitry operative to receive at least first and second reference signals and to generate an output reference signal, the switching circuitry being operative to select one of the at least first and second reference signals as the output reference signal in response to the at least first control signal, the voltage across the input stage being a function of the output reference signal of the switching circuitry.

8. The voltage level translator circuit of claim 7, wherein the switching circuitry comprises a multiplexer including at least a first input adapted to receive the first reference signal, a second input adapted to receive the second reference signal, and an output for generating the output reference signal, the multiplexer being operative to connect the output to one of the at least first and second inputs as a function of the at least first control signal.

9. The voltage level translator circuit of claim 7, wherein the switching circuitry comprises first and second transmission gates, an input of the first transmission gate being adapted to receive the first reference signal, an input of the second transmission gate being adapted to receive the second reference signal, and outputs of the first and second transmission gates being connected together and operative to generate the output reference signal, the first transmission gate being selectively activated in response to the first control signal, the second transmission gate being selectively activated in response to a logical complement of the first control signal.

10. A voltage level translator circuit for translating an input signal referenced to a first voltage supply to an output signal referenced to a second voltage supply, the circuit comprising:
an input stage for receiving the input signal, the input stage including at least one transistor device having a first threshold voltage associated therewith;
a latch circuit coupled to the input stage and operative to store a signal representative of a logic state of the input signal, the latch circuit including at least one transistor device having a second threshold voltage associated therewith, the second threshold voltage being greater than the first threshold voltage; and
a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies;
wherein at least a portion of the voltage level translator circuit is configurable for being selectively turned off in response to at least a first control signal supplied to the voltage level translator circuit.

11. The voltage level translator circuit of claim 1, wherein the voltage clamp circuit comprises a reference selection circuit comprising an NMOS device including a source adapted for connection to the first voltage supply, a gate and a drain of the NMOS device being connected together at a first node and being adapted for connection to the second voltage supply via a series resistance element, the reference selection circuit being operative to generate an output signal at the first node which is based at least in part on the voltage difference between the first and second voltage supplies, the voltage across the input stage being a function of the output signal of the reference selection circuit.

12. The voltage level translator circuit of claim 1, wherein the reference selection circuit comprises:
a first NMOS device including a source adapted for connection to the first voltage supply, a gate and a drain of the NMOS device being connected together at a first node;
a second NMOS device including a source adapted for connection to a third voltage supply, a drain connected to the first node, and a gate adapted for receiving a first control signal; and
a PMOS device including a source adapted for connection to the second voltage supply, a drain connected to the first node, and a gate adapted for receiving the first control signal, the reference selection circuit being selectively disabled in response to the first control signal;
wherein the reference selection circuit is operative to generate an output signal at the first node which is based at least in part on the voltage difference between the first and second voltage supplies, the voltage across the input stage being a function of the output signal of the reference selection circuit.

13. The voltage level translator circuit of claim 12, wherein the reference selection circuit further comprises a capacitor having a first terminal connected to the first node and having a second terminal adapted for connection to the third voltage supply.

14. The voltage level translator circuit of claim 1, wherein the first voltage supply is nominally about 1.0 volt and the second voltage supply is nominally about 3.3 volts.

15. The voltage level translator circuit of claim 1, wherein the input stage comprises first and second NMOS transistor devices, each of the first and second NMOS devices having the first threshold voltage associated therewith, a source of the first NMOS device and a source of the second NMOS device being adapted for connection to a third voltage supply, a drain of the first NMOS device being connected to the voltage clamp circuit at a first node, a drain of the second NMOS device being connected to the voltage clamp circuit at a second node, a gate of the first NMOS device being adapted to receive the input signal, and a gate of the second NMOS device being adapted to receive a logical complement of the input signal.

16. The voltage level translator circuit of claim 1, wherein the latch circuit comprises first and second PMOS transistor devices, each of the first and second PMOS devices having the second threshold voltage associated therewith, a source of the first PMOS device and a source of the second PMOS device being adapted for connection to the second voltage supply, a drain of the first PMOS device being connected to the voltage clamp circuit at a first node, a drain of the second PMOS device being connected to the voltage clamp circuit at a second node, a gate of the first PMOS device being connected to the drain of the second PMOS device, and a gate of the second PMOS device being connected to the drain of the first PMOS device.

17. An integrated circuit comprising at least one voltage level translator circuit for translating an input signal referenced to a first voltage supply to an output signal referenced to a second voltage supply, the at least one voltage level translator circuit comprising:
an input stage for receiving the input signal, the input stage including at least one transistor device having a first threshold voltage associated therewith;
a latch circuit coupled to the input stage and operative to store a signal representative of a logic state of the input signal, the latch circuit including at least one transistor device having a second threshold voltage associated therewith, the second threshold voltage being greater than the first threshold voltage; and
a voltage clamp circuit connected between the input stage and the latch circuit, the voltage clamp circuit being operative to limit a voltage across the input stage, an amplitude of the voltage across the input stage being controlled as a function of a voltage difference between the first and second voltage supplies;
wherein the voltage clamp circuit in the at least one voltage level translator circuit comprises a reference selection circuit operative to receive at least first and second reference signals having first and second amplitudes, respectively, associated therewith, and to select one of the at least first and second reference signals as an output signal of the reference selection circuit based at least in part on the voltage difference between the first and second voltage supplies, the voltage across the input stage being a function of the output signal of the reference selection circuit.

18. The integrated circuit of claim 17, wherein the voltage clamp circuit in the at least one voltage level translator circuit comprises a sensing circuit operative to receive at least the first and second voltage supplies and to generate at least a first control signal indicative of the voltage difference between the first and second voltage supplies, the voltage across the input stage being controlled as a function of the first control signal.

* * * * *